United States Patent [19]

Ariizumi

[11] Patent Number: 5,708,582

[45] Date of Patent: Jan. 13, 1998

[54] OPERATION TRACKING SYSTEM AND METHOD OF OPERATION USING THE SAME

[75] Inventor: Toru Ariizumi, Saitama, Japan

[73] Assignee: Yugen Kaisha Ariizumi (Gijyutsushi) Jimusho, Saitama, Japan

[21] Appl. No.: 585,307

[22] Filed: Jan. 11, 1996

[30] Foreign Application Priority Data

Jan. 19, 1995 [JP] Japan ................................. 7-024687

[51] Int. Cl.⁶ ........................................... G05B 19/42
[52] U.S. Cl. ........................................... 364/192
[58] Field of Search ........................... 364/192, 495, 364/900, 476.01; 395/3, 2.09, 2.28, 2.32; 73/851; 128/734

[56] References Cited

U.S. PATENT DOCUMENTS

| | | | |
|---|---|---|---|
| 4,328,556 | 5/1982 | Abe et al. | 364/900 |
| 5,062,053 | 10/1991 | Shirai et al. | 364/476 |
| 5,265,222 | 11/1993 | Nishiya et al. | 395/3 |
| 5,305,230 | 4/1994 | Matsumoto et al. | 364/495 |

*Primary Examiner*—Reba I. Elmore
*Assistant Examiner*—Monica Lewis
*Attorney, Agent, or Firm*—Robert W.J. Usher

[57] ABSTRACT

An operation tracking system has an operation device for repeating an operation for calculating a physical behavior, which corresponds to a certain change in a physical quantity of a predetermined model, for each predetermined unit of change in the physical quantity. A display shows, in response to the repeated operation by the operation device, the calculated physical behavior obtained by the operation device for each predetermined unit of change in the physical quantity. A temporary stop device temporarily stops the operation by the operation device. A condition altering device alters operation conditions in a temporarily stopped state effected by the temporary stop device. An operation restarting device restarts the operation by the operation device based on the operation conditions altered by the condition altering device after the operation is temporarily stopped by the temporary stop device.

8 Claims, 5 Drawing Sheets

OPERATION TRACKING SYSTEM AND METHOD OF OPERATION USING THE SAME

FIELD OF THE INVENTION

The present invention relates to a system for performing predictive analysis of transient physical behaviors such as nonlinear structural analysis using a computer or fluid analysis and, in particular, to an analysis system which can sequentially display the results of such predictive analysis.

BACKGROUND OF THE INVENTION

As such a computer analysis system, for example, there is a finite element method which has conventionally been well-known. Such an analysis system can be used for analyzing behavior prediction of transient physical behaviors in general. Typical examples thereof include i) predictive analysis of temperature distribution in an object in which fluctuating internal heating occurs, ii) predictive analysis of behaviors of objects when they move while in frictional contact with each other, and iii) predictive analysis of behaviors of an object when it moves in a short time.

Here, for example, when the predictive analysis of the temperature distribution is performed, since the heat transfer between the object and the external gas layer is influenced by an atmospheric temperature and a fluid flow, a very complicated phenomenon occurs, thereby making it difficult to set conditions for analysis.

The finite element method or the like has conventionally been used for performing such predictive analysis. Since it is difficult for the conditions for analysis to be set as mentioned above, in general, an analysis process has conventionally been performed as a first step using an empirical value or the like as initial conditions for heat transfer coefficient or the like. Then, based on the results of the first analysis process, various conditions have been reset to perform another analysis process.

At present, various kinds of general programs for performing such analysis are commercially available and being used. Examples of such programs include MSC/NASTRAN, ABAQUS, ANSYS, and MARC for structural analysis as well as PHOENICS and STAR-CD for fluid analysis. In these general analysis programs, however, an operation termination condition (e.g., a condition determining how many hours an operation is performed or how many steps a repeating operation is performed before termination) are set beforehand such that the operation is performed until this termination condition is attained and then the analysis is terminated. Namely, the analysis conditions are provided at the time of starting the analysis and there is no assumption that the analysis conditions may be altered during the operation.

In order to perform a computer analysis by using the general programs such as those mentioned above, it is necessary for a repeating operation to be conducted by the order of ten to thousand or ten thousand steps (or more enormous steps according to circumstances) according to time history or the like for each analysis process. The results of analysis cannot be obtained, in general, until the whole steps of operation are completed. Accordingly, in techniques in which analysis is redone by trial and error, for example, as mentioned above, where an analysis process is performed once by using an empirical value or the like and then another analysis process is performed, there is a problem that it takes enormous time and cost for performing the analysis.

SUMMARY OF THE INVENTION

The object of the present invention is to provide an analysis system (operation system) in which, without performing a plurality of times of an analysis operation comprising an enormous number of steps, an analysis condition can be optimized by trial and error in a short time.

Another object of the present invention is to provide an analysis system in which, during an analysis process comprising an enormous number of steps, this analysis process can be temporarily stopped in an arbitrary manner so as to alter analysis conditions, for example.

Still another object of the present invention is to provide an analysis system which, during an analysis process comprising an enormous number of steps, this analysis operation can be temporarily stopped and traced back in an arbitrary manner so as to alter analysis conditions, for example, from a traced-back state.

In order to attain these objects, the operation tracking system in accordance with the first embodiment of the present invention comprises an operation means for repeating an operation for calculating a physical behavior, which corresponds to a certain change in a physical quantity of a predetermined model, for each predetermined unit of change in the physical quantity and a display means for displaying, in response to the repeated operation, the calculated physical behavior obtained by the operation means. The operation tracking system in accordance with the present invention is further configured such that a temporary stop means can temporarily stop the operation and, in a temporarily stopped state, a condition altering means can alter operation conditions, thereby an operation restarting means can restart the operation based on thus altered operation conditions thereafter.

The operation tracking system in accordance with the second embodiment of the present invention comprises, in addition to an operating device and a display device which are respectively similar to the operation means and display means mentioned above, an input terminal having a signal input means such as an input key or a mouse. This input terminal is configured such that, by manipulating the signal input means, a temporary operation stop signal can be transmitted to the operating device for temporarily stopping the operation thereof and, when the operation is temporarily stopped in response to this temporary operation stop signal, a condition altering screen for altering the operation condition can be displayed on the display device so that, based on the condition altering screen, the signal input means can be manipulated so as to alter the operation conditions. Also, it is configured such that an operation restarting signal for restarting the operation using thus altered operation conditions can be transmitted to the operating device.

Here, this system may be provided with a storage device for storing the results of operation for each repeated step. Preferably, when the operation is temporarily stopped, the signal input means is manipulated so as to input a step-back signal for tracing back the operation by an arbitrary number of repeating steps to the storage device and, when this step-back signal is input, the results of operation from the step traced back by the arbitrary number of repeating steps are read out from the storage device, whereby thus read-out results of operation and the altered operation conditions are used to restart the operation.

The operation tracking system in accordance with the third embodiment of the present invention comprises an operation means for repeating an operation for calculating a physical behavior, which corresponds to a certain change in a physical quantity of a predetermined model, for each predetermined unit of change in the physical quantity; an operation control means for controlling the operation performed by the operation means; and a display means for displaying, in response to the operation, the calculated physical behavior obtained by the operation means. Here, the operation means completes one set of analysis after performing a predetermined number of repeating steps of operation which has been set beforehand. The operation control means comprises an analysis execution means for setting one or a plurality of steps as the predetermined number of steps so as to perform an operation analysis; an operation condition setting means for setting, each time the operation analysis is completed, operation conditions for the next analysis based on the results of analysis; an operation continuing means for continuously performing the operation analysis using thus set operation conditions; a temporary stop means for temporarily stopping the operation; a condition altering means for altering conditions for the operation in a temporarily stopped state; and an operation restarting means for restarting the operation analysis based on thus altered conditions.

An operation method in accordance with the present invention is a method for calculating a physical behavior by using a system which comprises an operation means for calculating a physical behavior which corresponds to a certain change in a physical quantity of a predetermined model; an operation control means for controlling the operation performed by the operation means; and a display means for displaying, in response to the operation, the calculated physical behavior obtained by the operation means. This method comprises the steps of a first step for setting one or a plurality of repeating operation steps as number of operation steps for a single operation analysis process so as to perform the single operation analysis process; a second step for setting, based on the results of analysis for each single operation analysis process, operation conditions for performing the next analysis process; a third step for performing the next operation analysis process using thus set operation conditions; and a fourth step for repeating the second and third steps until a predetermined completing condition is satisfied. Further, the method in accordance with the present invention is configured such that, when a temporary stop signal is received during the execution of the fourth step, the operation analysis is temporarily stopped such that the operation conditions can be altered during the time when the operation is temporarily stopped and then, when an operation restarting signal is received, the execution of the fourth step is restarted based on the altered conditions.

DESCRIPTION OF THE PREFERRED EMBODIMENTS

Figure 1:
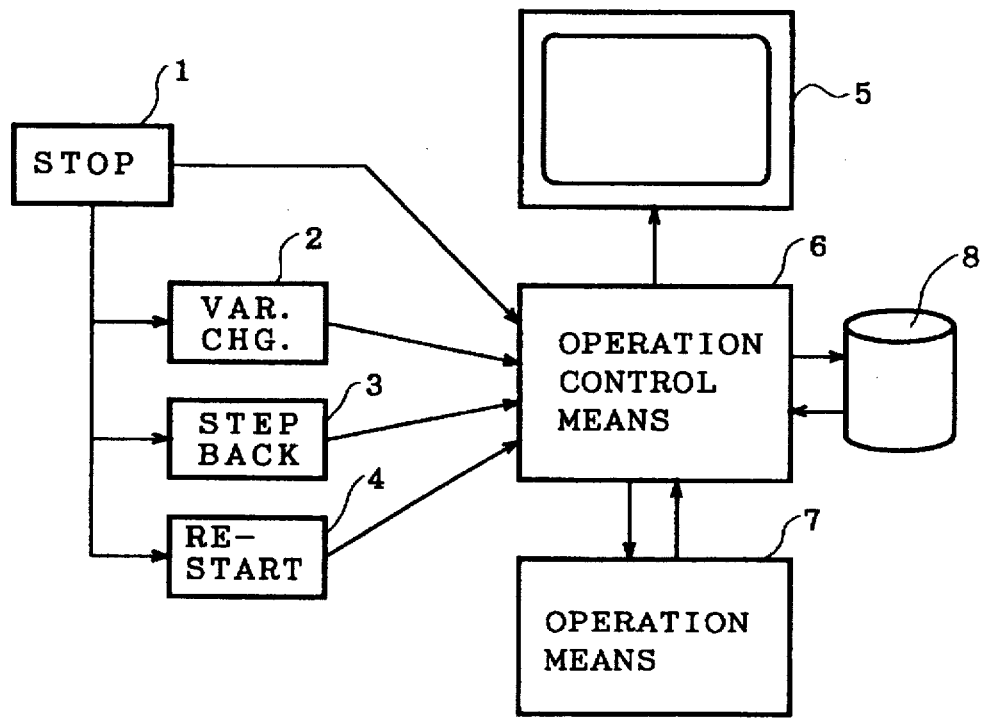
FIG. 1 is a block chart showing a configuration of an operation tracking system in accordance with the present invention.

FIG. 1 shows a configuration of an operation tracking system in accordance with the present invention. This system is provided with an operation means 7 for repeating an operation for calculating a physical behavior, which corresponds to a certain change in physical quantity of a predetermined model, by using a predetermined unit of this physical quantity as a step. This operation means 7 contains a general program based on which the operation is performed. This system also has an operation control means 8 for controlling the operation in the operation means 7, so that the operation analysis in the operation means 7 using the general program is performed while being controlled by the operation control means 6. The results of the operation are displayed on a display device 5 and, for each step, stored in a memory 8.

Further, this system comprises a temporary stop means 1 for temporarily stopping, when such an operation is being performed, the operation; a condition altering means 2 for altering operation conditions, during the time when the operation is temporarily stopped; a step-back means 3 for tracing back the results of calculation by an arbitrary number of steps; and an operation restarting means 4 for restarting the temporarily stopped operation.

Figure 2:
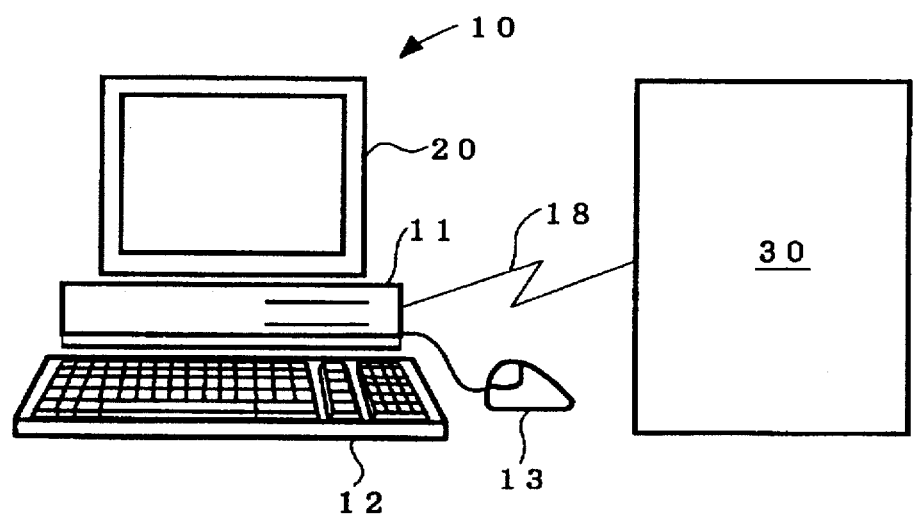
FIG. 2 is a schematic view showing an example of configuration of an apparatus embodying the operation tracking system.

An example of an apparatus having such a system is shown in FIG. 2. This apparatus basically comprises a terminal 10 and a host computer 30. Examples of the host computer 30 include supercomputer, general computer, and operation server. Examples of the terminal 10 include engineering workstation, graphics workstation, and personal computer. The terminal 10 and the host computer 30 are connected to each other by way of a network line 18 such as telephone line. Here, the terminal 10 comprises a display 20 for displaying the results of operation, a terminal operation unit 11, a keyboard 12, and a mouse 13.

In this example, the operation means 7 and the memory a shown in FIG. 1 are constituted by the host computer 30; the display means 5 is constituted by the display 20; the operation control means 6 is constituted by the terminal unit 11; and the temporary stop means 1, condition altering means 2, step-back means 3, and operation restarting means 4 are constituted by the terminal operation unit 11, keyboard 12, and mouse 13.

Figure 3:
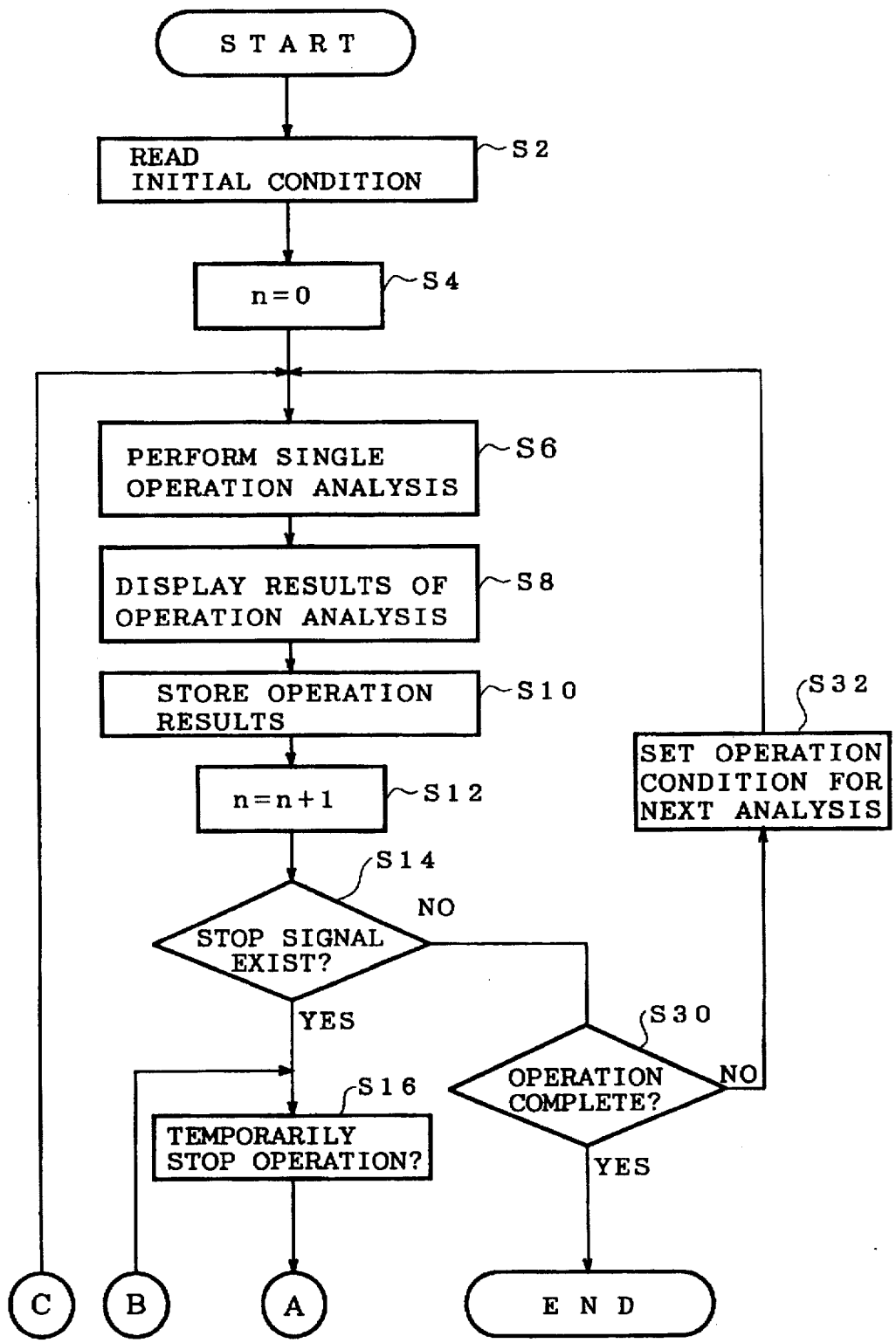
FIG. 3 is a flow chart showing the contents of operation processing performed by the operation tracking system.
Figure 4:
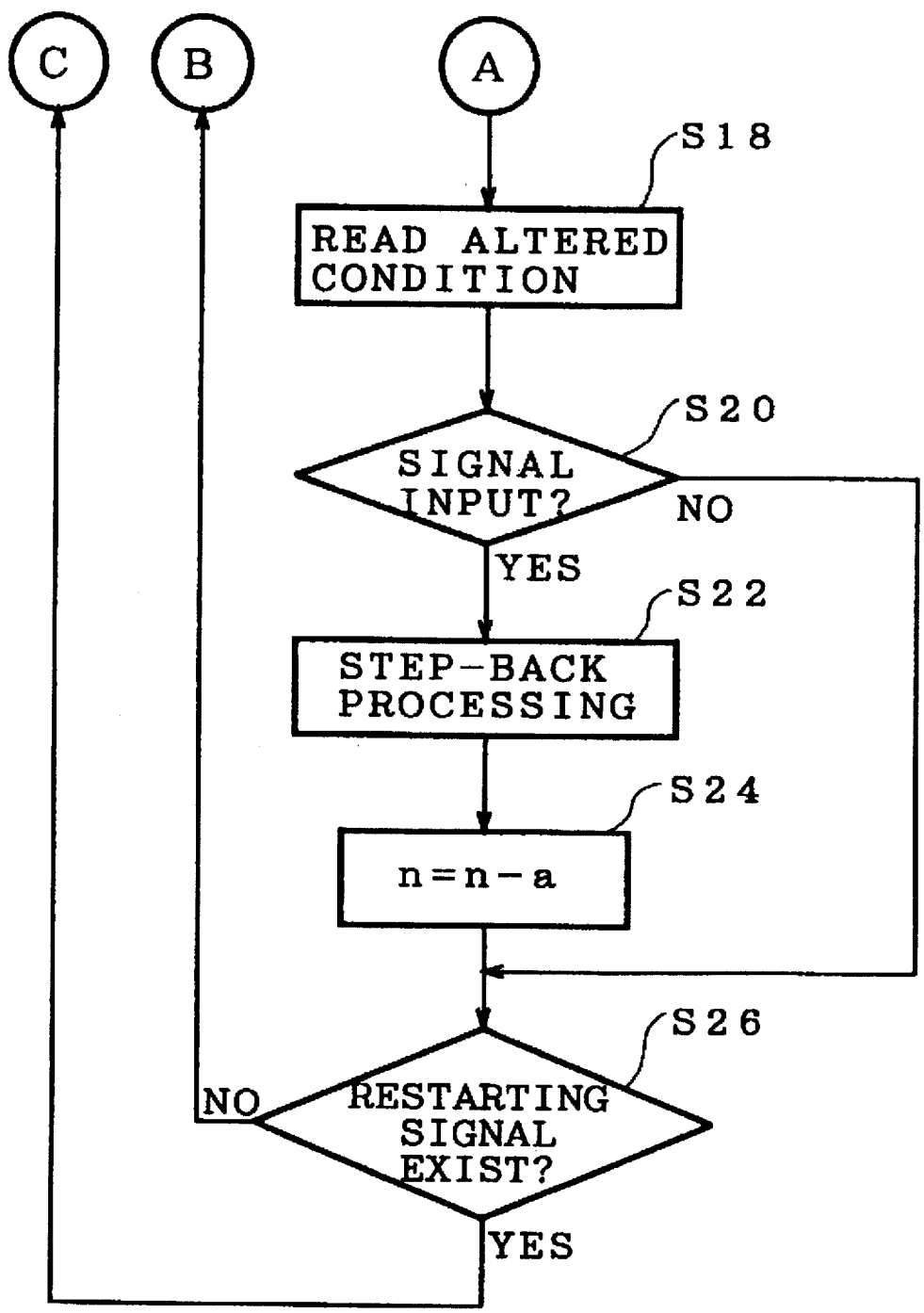
FIG. 4 is a flow chart showing the contents of operation processing performed by the operation tracking system.

In the following, the action of this system will be explained with reference to the flow charts shown in FIGS. 3 and 4. Here, in order to facilitate the explanation, it is assumed that deformation (physical behavior) of a cantilevered rectangular parallelopiped member upon radiation heat is calculated for each predetermined time unit at a predetermined ambient temperature. FIGS. 3 and 4 can be combined at their circled A, B, and C to form a single flow chart.

In this analysis process, in the first place, initial conditions (e.g., set conditions such as form and material of the member, analysis conditions such as radiation heat condition, and interface conditions such as heat transfer coefficient between the member and an external gas layer) are read into the operation means 7 (step S2). For example, these initial conditions may be input from the keyboard 12 or read out from a magnetic tape or card in which they have been input. Then, the initial value of step number n for a repeating operation is set as n=0 (step S4).

Thereafter, the operation means 7 performs a single operation analysis process using the general program (step S6) and then the results of this operation are displayed on the display means (display 20; step S8) and, at the same time, stored in the memory (step S10). As the single analysis process is completed in this manner, 1 is added to the repeating operation analysis number n (step S12).

Accordingly, it can be seen from the value of the repeating operation analysis number n that how many times the operation analysis process by the general program has been performed.

Here, this system has been set such that a single operation analysis process using the general program is completed after only one or several steps thereof are performed. The steps S6 to S12 used therefor are completed in a very short time. Then, at step S14, it is judged whether there is a temporary stop signal or not and then, when there is no input of this signal, the flow proceeds, unless the operation completing condition is satisfied at step S30, to step S32 for setting an operation condition for the next analysis process.

Since a single analysis process is completed at step S6 by operating a predetermined number of steps which is a small number, though, the above-mentioned condition sets an operation condition necessary for performing the next analysis process based on the results of thereof. Namely, at step S32, based on the results of the previous process analyzed by the general program, initial conditions for performing the operation analysis using the general program are newly set and then the flow returns to step S6 so as to execute the next analysis process. However, since the new initial conditions set this time are based on the results of the previous analysis process, it is apparently seen that the operation by the general program continues.

Figure 5:
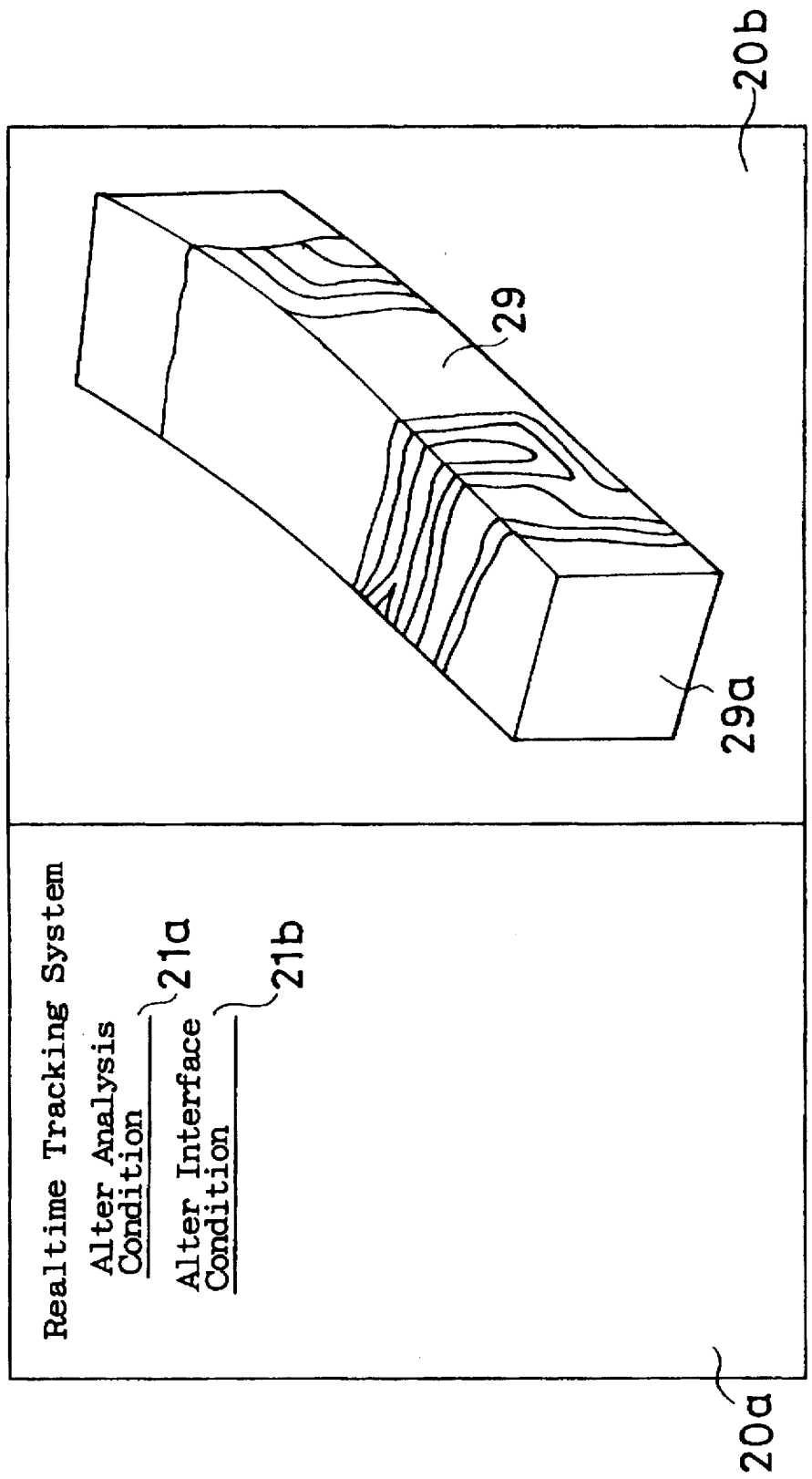
FIG. 5 is a front view showing an example of a screen on a display during the operation processing.
Figure 6:
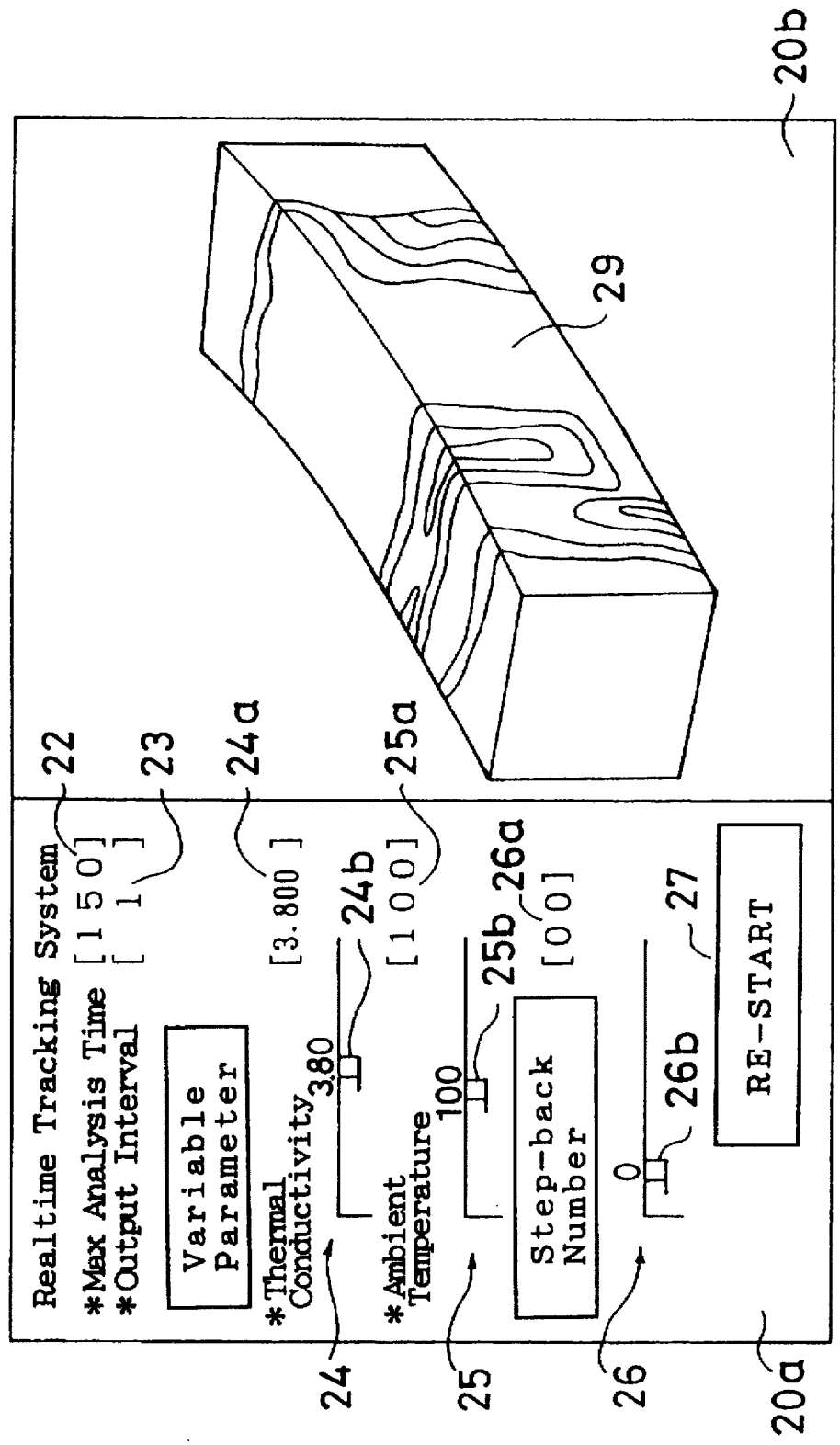
FIG. 6 is a front view showing an example of a screen on a display when the operation is temporarily stopped during the operation processing.

Then, the foregoing operation analysis is repeated. An example of screen on the display 20 during such operation is shown in FIG. 5. The screen on the display 20 is divided into a left screen 20a and a right screen 20b. On the left screen 20a, an analysis condition altering button 21a and an interface condition altering button 21b are displayed. On the right screen 20b, on the other hand, a rectangular parallelopiped member 29, which is cantilevered at an end 29a thereof, is displayed with its deforming state at the time when its surface receives a heat radiation which has been set under the initial condition. This deforming state is displayed with exaggeration such that it can be clearly understood, while the state of stress within the member at this time is displayed on the surface of the member as stripes. The actual display 20 can display colors and, accordingly, the stripe-like stress is displayed in color, thereby facilitating the viewing thereof.

If the operation is continued as it is, it will continue until the operation completing condition is satisfied and then the analysis by this system will be completed. However, in this system, this operation can be temporarily stopped. Accordingly, on the left screen 20a, the analysis condition altering button 21a and the interface condition altering button 21b are displayed.

In view of the right screen 20a on the display, an operator conducting this analysis can observe the deforming behavior of the member 29 on real time with the operation. In this case, when the deforming behavior is greatly different from the actual behavior or inconsistent with an expected behavior, a key in the keyboard 12 or the mouse 13 can be operated so as to position a cursor at the analysis condition altering button 21a or the interface condition altering button 21b and then click it, thereby transmitting a temporary stop signal to the operation means 7 so as to temporarily stop the operation.

Accordingly, in this system, each time a single operation process is completed, it is judged at step S14 whether the temporary stop signal is input or not. In the case where the temporary stop signal is input, the flow proceeds from step S14 to S18 so as to temporarily stop the operation and, as will be explained later, waits until it is judged at step S26 that an operation restarting signal is input.

Here, for example, it is assumed that the interface altering button 21b on the screen of the display 20 is clicked. In response thereto, a temporary stop signal is input to the operation means 7 so as to stop the operation in the operation means 7 (step S16) and, simultaneously, the screen of the display 20 is altered as shown in FIG. 8.

This screen is also divided into two screens of the left screen 20a and right screen 20b. Variable parameter, step-back number, and the like are displayed on the left screen 20a; whereas the condition of the member 29 showing the results of the operation at the time when temporarily stopped is displayed on the right screen 20b.

In this example, maximum analysis time, output interval, variable parameter, and step-back number are displayed on the left screen. Maximum analysis time 22 and output interval 23 can be altered as the keyboard 12 is manipulated. On the other hand, the variable parameter refers to interface conditions which can be altered in this analysis and comprises a thermal conductivity display 24 and an ambient temperature display 25 in this example. Their currently set values are displayed at their set-value displaying columns 24a and 25a together with set-value altering cursors 24b and 25b.

The interface conditions can be altered when the mouse 13 is manipulated so as to drag the set-value altering cursors 24b and 25b left or right. Simultaneously, thus altered set values are displayed at the display columns 24a and 25a. Alternatively, the values at the display columns 24a and 25a may be directly changed by key input.

The left screen 20a also includes a step-back number display 28 in which the initial value of the step-back number is set at zero. In a manner similar to the above, its set-value altering cursor 26b may be moved or its display column 26a may be changed by key input to alter the step-back number.

When an operation condition is altered in this manner, thus altered operation condition is read into the operation means 7 (step S18). Simultaneously, it is watched whether a step-back signal is input or not (step S20). When step-back number a is input as explained above, the flow proceeds to step S22 where a step-back processing is performed. The step-back processing refers to a processing in which the operation processing is traced back by the input step-back number a. The results of operation at thus traced-back step are read out from the memory 8 and substitute for the results of the current operation. Accordingly, the display of the right screen 20b is also changed to that traced back by the step-back number a. Then, the value obtained when this step-back number a is subtracted from the repeating operation step number n is set at step S24 as current operation step number n.

Here, when no step-back signal is input (when the step-back number a remains zero), processings of steps S22 and S24 are not performed.

When the operation is to be restarted after the alteration of the conditions and input of the step-back number, a restarting button 27 at the lower end of the left screen 20a is clicked. Accordingly, an operation restarting signal is transmitted to the operation means 7 and then, when the input of the operation restarting signal is detected at step S26, the flow returns to step S6 so as to start the operation for the next step.

Subsequently, the foregoing flow is repeated so as to continue the analysis until it is judged at step S30 that the operation is completed.

As explained above, in this system, the operation can be temporarily stopped at an arbitrary time so as to alter operation conditions. Accordingly, in view of the results of the operation displayed on the display 20 on real time with the operation, when the condition is unfavorable, the operation can be instantly stopped to alter an operation condition. Then, the operation can be restarted on the basis of thus altered condition, while the altered condition can be evaluated in view of the displayed results of the restarted operation. Thus, the operation condition can be evaluated in a trial and error manner in a single analysis process, thereby making it possible to seek a target conditional value in a very short time.

In the above-mentioned analysis of physical behaviors, it is often very difficult for operation conditons to be set. However, in this system, an operation can be started with an arbitrarily set condition and then, in view of the displayed results of this operation, when these results are technologically inconsistent with the actual behavior, the operation can be stopped at any time to alter the conditon, thereby narrowing down appropriate operation conditions. Namely, this system can be used as a tool for narrowing down uncertain operation conditions, thereby easily narrowing down the operation conditions in a short time.

In this system, since an arbitrary step-back processing can be performed when the operation is temporarily stopped, even when there is no consistency at the time when temporarily stopped, the operation can be stepped back to the point where the consistency can be secured, thereby performing a consistent analysis.

Further, as can be understood from the foregoing explanation, a general analysis program can be used, as it is, in the operation means 7 in the operation tracking system of the present invention, so that the analyzing capacity of the general analysis program can be utilized as it is.

Though the thermal deformation of a member, as a physical behavior, is repeatedly calculated for each change in a predetermined time unit in the above-mentioned example, without being restricted thereto, the physical behavior may be of various kinds such as motion of an object and flow behaviors. Also, the physical quantity which forms a basis for the repeated operation is not restricted to time but may be of various kinds such as temperature and position.

Further, the configuration of the apparatus shown in FIG. 2 is only an example of the configuration of the apparatus in which the operation tracking system of the present invention is used. For example, when the program used in the operation means is relatively simple and the operation means and the memory can be installed within the terminal operation unit 11 of the terminal 10, the terminal 10 alone may constitute an apparatus provided with the operation tracking system of the present invention.

Also, the terminal may be constituted by the display, the keyboard, and the mouse alone such that the terminal is used as means for displaying the results of the operation and means for inputting temporary stop and condition altering signals, for example. In this case, the host computer performs the whole processing such as system starting, operation, image data displaying processing, and operation condition altering processing.

Further, a plurality of terminals may be used or the host computer may be constituted by a plurality of computers.

What is claimed is:

1. An operation tracking system comprising:
   an operation means for repeating an operation for calculating a physical behavior, which corresponds to a certain change in a physical quantity of a predetermined model, for each predetermined unit of change in said physical quantity;
   an operation control means for controlling the operation performed by said operation means; and
   a display means for displaying, in response to the repeated operation by said operation means, the calculated physical behavior obtained by said operation means for each predetermined unit of change in said physical quantity;
   said operation means completing one set of analysis after performing a predetermined number of repeating steps of operation which has been set beforehand,
   said operation control means comprising:
      an analysis execution means for setting one or a plurality of steps as said predetermined number of steps so as to perform an operation analysis by said operation means;
      an operation condition setting means for setting, each time the operation analysis is completed by said analysis execution means, operation conditions for a next analysis based on results of thus completed analysis;
      an operation continuing means for making said analysis execution means continuously perform the operation analysis using thus set operation conditions;
      a temporary stop means for temporarily stopping the continuation of the operation by said operation continuing means;
      a condition altering means for altering said operation conditions for said operation under a state temporarily stopped by said temporary stop means; and
      an operation restarting means for making said operation continuing means restart the operation analysis based on the operation conditions altered by said condition altering means after said operation is temporarily stopped by said temporary stop means.

2. An operation tracking system according to claim 1, wherein said operating means uses a general program by which a repeated calculation is performed so as to effect the analysis, while, each time one or a plurality of sets of the repeated calculation by said general program are effected, said operation condition setting means sets the operation condition for renewal and judges whether there is a temporary stop instruction from said temporary stop means or not, thereby making said operation continuing means continue the operation when there is no temporary stop instruction.

3. An operation tracking system according to claim 1, wherein said operation control means has a signal input means, while transmission of a temporary stop signal for temporarily stopping said operation from said temporary stop means, transmission of a condition altering signal for altering the operation conditions from said operation altering means, and transmission of an operation restarting signal for restarting the operation from said operation restarting means are effected by said signal input means.

4. An operation tracking system according to claim 3, wherein said signal input means comprises a keyboard.

5. An operation tracking system according to claim 3, wherein said display means displays, during the time when said operating device performs the operation, the physical behavior of said predetermined model corresponding to results of the operation and a button for inputting said temporary stop signal,
   while displaying, during the time when said operation is temporarily stopped, the physical behavior of said predetermined model corresponding to results of the operation at the time when said operation is temporarily stopped and a screen for altering the operation conditions.

6. An operation tracking system according to claim 1, further comprising a step-back means for attaining results of said repeated operation traced back by an arbitrary number of steps when temporarily stopped by said temporary stop means, said operation restarting means making said operation continuing means restart the operation analysis from an operation state traced back by said arbitrary number of steps based on the operation conditions altered by said condition altering means.

7. A method for calculating a physical behavior by using an operation system which comprises an operation means for calculating said physical behavior, which corresponds to a certain change in a physical quantity of a predetermined model, for each predetermined unit of change in said physical quantity; an operation control means for controlling the operation performed by said operation means; and a display means for displaying, in response to the repeated operation by said operation means, the calculated physical behavior obtained by said operation means for each predetermined unit of change in said physical behavior, said method comprising the steps of:

a first step for setting one or a plurality of repeating operation steps as number of operation steps for a single operation analysis process so as to make said operation means perform the single operation analysis process;

a second step for setting, based on results of analysis for each single operation analysis process, operation conditions for performing a next analysis process;

a third step for making said operation means perform the next operation analysis process using thus set operation conditions; and a fourth step for repeating said second and third steps until a predetermined completing condition is satisfied, during the execution of said fourth step, said operation analysis being temporarily stopped when a temporary stop signal is received, said operation conditions of said operation being permitted to be altered during the time when said operation is temporarily stopped, and the execution of said forth step then being restarted based on thus altered operation conditions when an operation restarting signal is received.

8. A method for calculating a physical behavior by using an operation system according to claim 7, wherein results of said operation analysis can be traced back by an arbitrary number of steps during the time when the operation is temporarily stopped and then, when said operation restarting signal is received, the execution of said fourth step is restarted based on the results of the operation analysis traced back by said arbitrary number of steps and said altered operation conditions.

* * * * *